(12) United States Patent
Patland et al.

(10) Patent No.: US 7,230,420 B2
(45) Date of Patent: Jun. 12, 2007

(54) MAGNETORESISTIVE ELEMENT LIFECYCLE TESTER WITH TEMPERATURE CONTROL

(75) Inventors: Henry Patland, Los Gatos, CA (US); Wade A. Ogle, San Jose, CA (US)

(73) Assignee: Infinitum Solutions, Inc., Santa Clara, CA (US)

( * ) Notice: Subject to any disclaimer, the term of this patent is extended or adjusted under 35 U.S.C. 154(b) by 205 days.

(21) Appl. No.: 11/159,635

(22) Filed: Jun. 22, 2005

(65) Prior Publication Data
US 2005/0258827 A1  Nov. 24, 2005

Related U.S. Application Data

(63) Continuation-in-part of application No. 10/418,382, filed on Apr. 17, 2003, now Pat. No. 6,943,546.

(51) Int. Cl.
*G01R 33/18* (2006.01)

(52) U.S. Cl. ............... 324/209; 324/210; 333/201
(58) Field of Classification Search ........... 324/210, 324/209; 333/201
See application file for complete search history.

(56) References Cited

U.S. PATENT DOCUMENTS

| 5,670,889 A | 9/1997 | Okubo et al. ............ 324/760 |
| 2002/0024354 A1* | 2/2002 | Pietzschmann ............ 324/765 |

OTHER PUBLICATIONS

Advanced Probing System, Inc., "Effects of 'On the Shelf' Probe Tip Oxidation on Contact Resistance", Technical Bulletin—Jul. 1999, 1 page.

* cited by examiner

*Primary Examiner*—Stephen E. Jones
(74) *Attorney, Agent, or Firm*—Silicon Valley Patent Group LLP

(57) ABSTRACT

A lifecycle analyzer includes a temperature control element for controlling the temperature of a plurality of magnetoresistive (MR) elements, which may be, e.g., in bar, slider, head gimbal assembly, or head stack assembly form. The MR elements are in electrical contact with a stress probe element for applying a bias voltage or current stress. The MR elements and/or a magnetic field generator are moved to place one or more MR elements within the magnetic field of the magnetic field generator for testing. During testing, the MR elements are in electrical contact with a test probe element. The temperature of the MR elements may be controlled during both the stressing and testing.

38 Claims, 6 Drawing Sheets

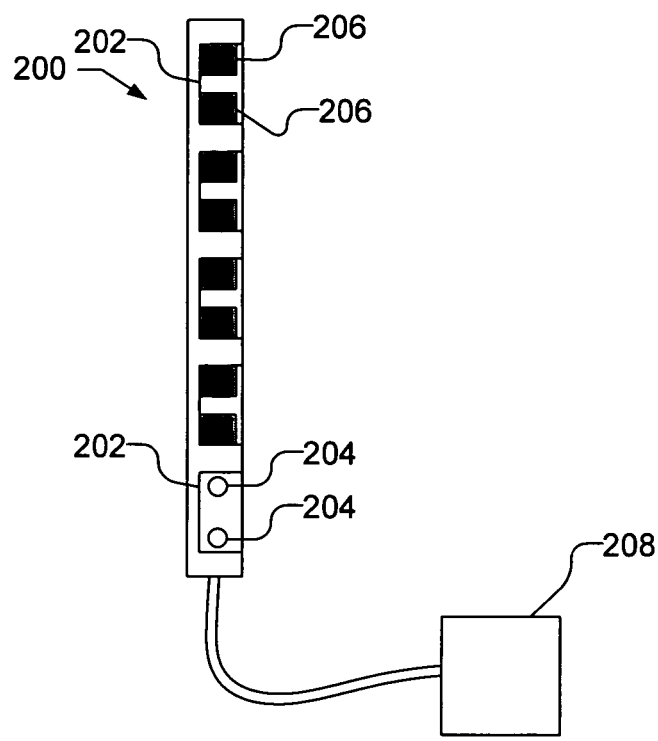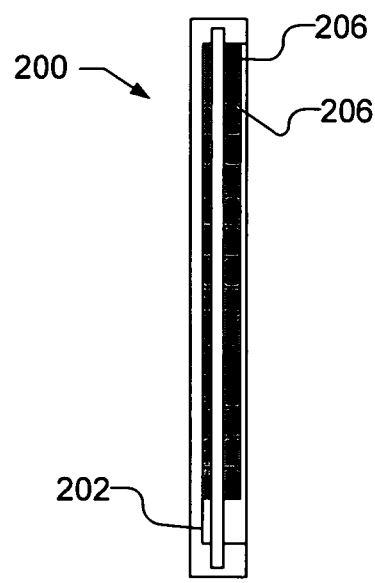
Fig. 6A  Fig. 6B
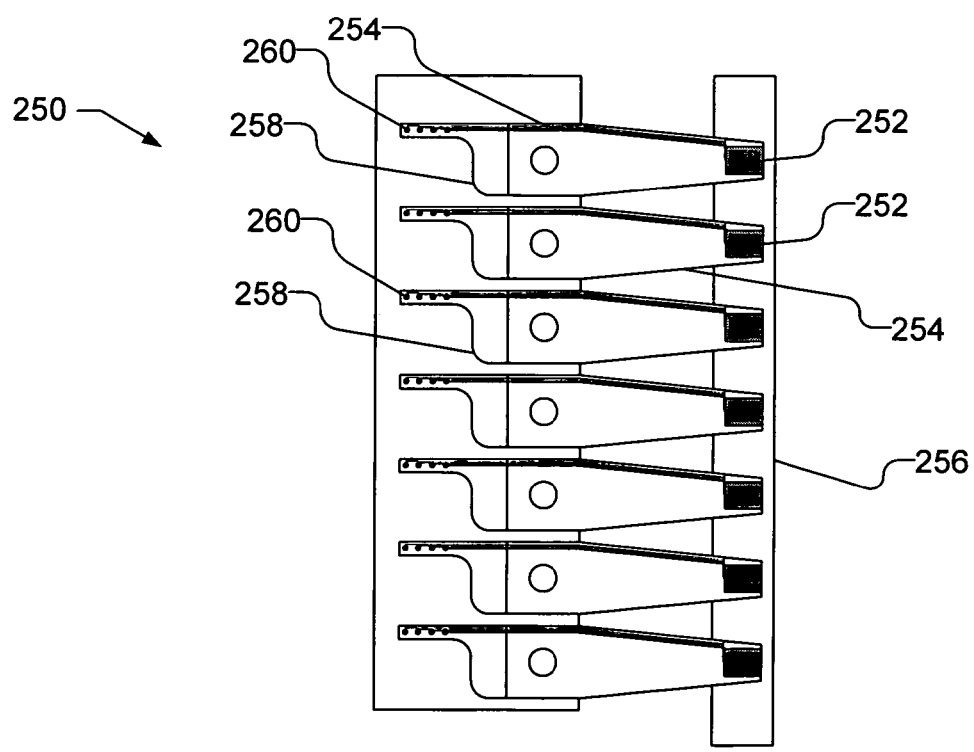
Fig. 7

MAGNETORESISTIVE ELEMENT LIFECYCLE TESTER WITH TEMPERATURE CONTROL

CROSS REFERENCE TO RELATED APPLICATION

This application is a continuation-in-part of U.S. patent application Ser. No. 10/418,382, filed Apr. 17, 2003 now U.S. Pat. No. 6,943,546, entitled "Bar Level Lifecycle Tester", which is incorporated herein by reference.

BACKGROUND OF THE INVENTION

1. Field of the Invention

The present invention relates to testing a thin-film magnetic heads with a magnetoresistive effect (MR) elements and in particular to testing multiple MR elements with thermal control.

2. Discussion of the Related Art

It is desirable to test the lifecycle of magnetoresistive (MR) elements to ensure long term adequate performance. Generally, testing the lifecycle of MR elements includes stressing MR elements with an increased ambient temperature while applying bias current to the MR element and/or write element.

In one type of conventional lifecycle testing, the MR elements are stressed and tested in an environment with a raised ambient temperature, i.e., in an oven. Typically, in oven tests, a number of MR elements are connected to a bias current source, the MR elements are heated and the resistance in the MR elements is tested.

Resistance measurements of MR elements, however, is a relatively crude assessment of the MR elements performance. In general, a more thorough analysis of the performance of the MR elements is desirable. By way of example, MR elements can be more thoroughly analyzed using Quasistatic tests such as, Amplitude, Asymmetry, Barkhausen Jump, Spectral Maximum Amplitude Noise (SMAN), and Popcorn Noise, which are well known in the art. Quasistatic tests are performed within a magnetic field, and typically require a short cable connection, e.g., 2 to 3 inches, to the MR element. Oven tests, on the other hand, do not include magnetic fields and use relatively large connections, e.g., 2 feet.

Another conventional lifecycle test is performed at the head gimbal assembly (HGA) level, i.e., where the MR head is mounted on the HGA and can include Quasistatic testing. Testing at the HGA level is advantageous because it can be done within the magnetic fields and uses short cable connections. During testing, the MR heads are placed on a heating block and the bias and writing stresses can be applied through the HGA. Typically, HGA lifecycle testing is performed on 1 to 8 heads at a time. Current technology, however, limits the tests to a maximum of approximately 8 heads due to size constraints of magnetic fields and short cable connects. Thus, if a large data sample is desired, many testers are required. Further, HGA level tests are late in the manufacturing process, i.e., the processing of the MR heads must be completed and the heads mounted on the head gimbal assembly prior to testing.

Thus, what is needed is a lifecycle tester that can perform Quasistatic tests on many MR elements simultaneously early in the process.

SUMMARY

In one aspect of the present invention, an apparatus for stressing and testing a plurality of MR elements includes at least one stress probe element having a plurality of probe pins and a temperature control element for controlling the temperature of the MR elements. The apparatus further includes at least one magnetic field generator and at least one test probe element having a plurality of probe pins. The probe pins of the test probe element are positioned to electrically connect with at least one magnetoresistive element when the magnetoresistive element is within the magnetic field. The apparatus also has a positioning system for positioning the magnetoresistive elements within the magnetic field. The positioning system also places the magnetoresistive elements and the probe pins of the stress probe element in electrical contact and places at least one magnetoresistive element and the probe pins of the test probe element in electrical contact when the at least one magnetoresistive element is within the magnetic field. In some embodiments, the MR elements may be in a bar, slider, head gimbal assembly, or head stack assembly form.

Another aspect of the present invention includes a method of stressing and testing a plurality of MR elements. The method includes controlling the temperature of the MR elements and providing a bias stress to the MR elements at a first location, moving at least one of the MR elements and a magnetic field generator and testing the MR elements when positioned within a magnetic field generated by the magnetic field generator. The MR elements, which may be in, e.g., bar, slider, head gimbal assembly, or head stack assembly form, may be temperature controlled during testing.

Another aspect of the present invention includes a method of stressing and testing a plurality of MR elements that includes controlling the temperature of the MR elements. A first plurality of probe pins are placed in electrical contact with the MR elements and either a bias current or a bias voltage is applied to the MR elements through first plurality of probe pins. The first plurality of probe pins are disengaged from the MR elements and a second plurality of probe pins are placed in electrical contact with at least one MR element. A magnetic field is generated around at least one of the MR elements and at least one parameter from MR element is measured through the second plurality of probe pins while the MR element is in the magnetic field.

BRIEF DESCRIPTION OF THE DRAWINGS

FIGS. 6A and 6B illustrate a top view of an arm that holds a plurality of individual MR elements in the form of sliders.

FIG. 7 illustrates a top view of another embodiment of an arm that holds a plurality of individual MR elements in the form of head gimbal assemblies (HGAs).

DETAILED DESCRIPTION

Figure 1:
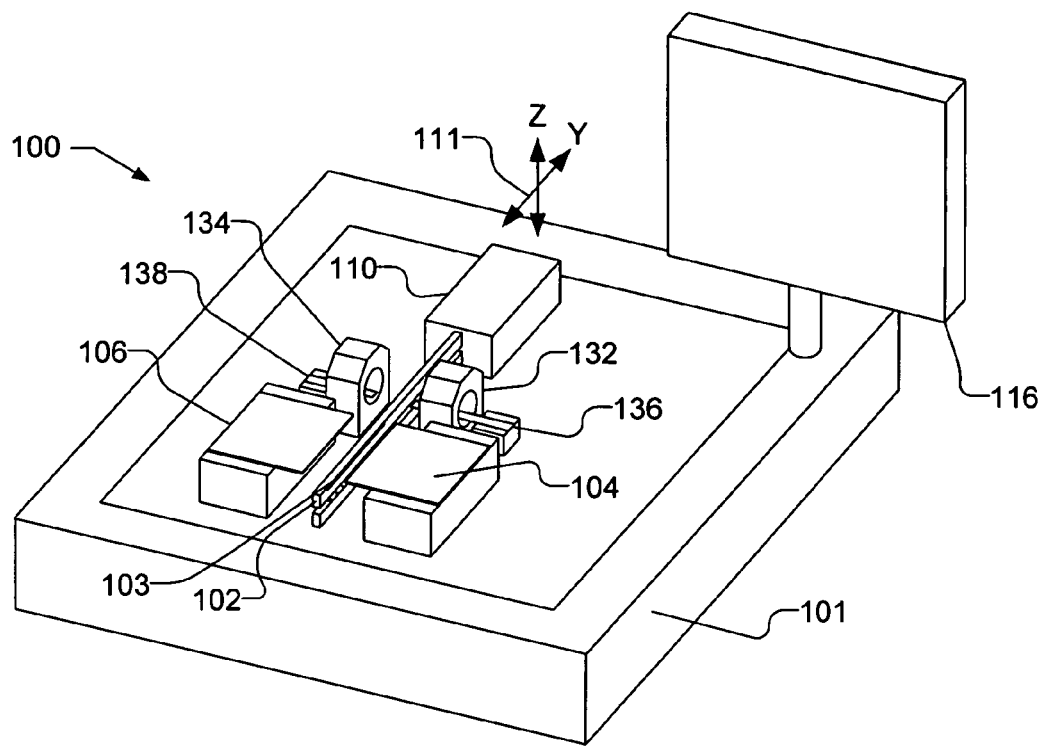
FIG. 1 is an isometric view of a lifecycle tester, in accordance with an embodiment of the present invention.
Figure 2:
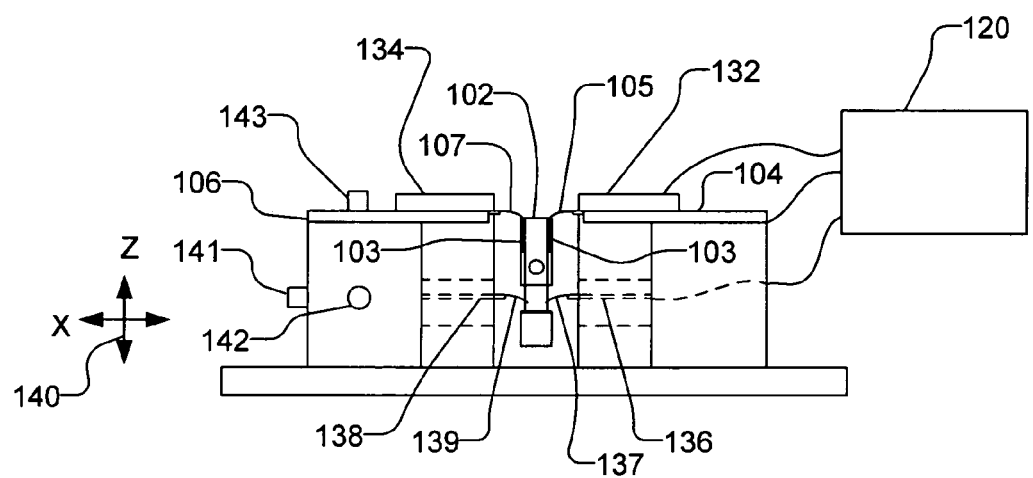
FIG. 2 is a front view of a portion of the tester.

FIG. 1 is an isometric view of a lifecycle tester 100 that may be used to stress and test a plurality of MR elements, in accordance with an embodiment of the present invention. The MR elements that are stressed and tested with tester 100 before the MR elements are sliced into individual elements, e.g., at bar level. FIG. 2 is a front view of a portion of tester 100. Tester 100 may be used to provide stress to MR elements for an extended period of time and to test the performance of the stressed MR heads over time.

Tester 100 includes an isolation table 101, upon which is a bar heater arm 102. One or two bars 103 may be held and heated by the bar heater arm 102. The bar heater arm 102 includes a heating element that may be heated, e.g., between 50° and 150° C., or any other desired range. As can be seen in FIG. 2, tester 100 can be used to simultaneously test two bars 103. Of course, if desired, only one bar need be tested at a time.

Tester 100 further includes stress probe cards 104 and 106. The stress probe cards may be manufactured by, e.g., SV Probe, Inc. located in San Jose, Calif. Each stress probe card 104 and 106 includes 184 probe pins, collectively 105 and 107, which are manufactured, e.g., from NewTek-Probes™. The probe pins are not shown in FIG. 1 for clarity. The geometry of the probes, such as bend angles of the tips and placement in the epoxy rings, is determined to achieve a desired balanced contact force, i.e., the force applied by the probes as they are deflected, which is, e.g., 2.0 grams per mil, where the probe pins 105 and 107 have a 1.5 mil tip diameter. Because of the heating and consequential expansion of the bar, the probe tip dimensions are centered on the contact pads on a bar that is at the target temperature, e.g., 100° C. By centering the probe tip on the contact pads, the probe pins will be able to accommodate a range of temperatures, e.g., ±50° C., depending on the expansion coefficient of the bar and the dimensions of the contact pads. The probe cards are manufactured with a high temperature epoxy to withstand the elevated temperature.

The stress probe cards 104 and 106 are coupled to a processor 120, which controls the stress probe cards to provide a bias stress to the MR elements on the bar 103 and, if desired, a write stress, to some write elements adjacent to MR elements. Processor 120 may be, e.g., a Pentium III™ processor with 20 GB drive and 256 MB RAM, with a Win98™ or Win2000™ operating system, or other suitable system. Processor 120 may control stress probe cards 104 and 106 to apply the same stresses to each MR element or to provide different stresses to individual or groups of MR elements.

The stress read bias, for example, may have 96 independent channels that may operate in true current or voltage bias modes. By way of example, the range of current bias may be ±20, 10, and 5 mA with a resolution of 9.8, 4.9, and 2.45 µA.

The range of voltage bias may be ±1, 0.5, and 0.25 V, with a resolution of 0.49, 0.24, 0.12 V. The bias may selectably be turned off during write.

The write stress may have 16 independent channels. By way of example, the write current range may be 16.5 to 72 mA bp, with a current resolution of 1.8 mA. The frequency range may be 12.5 to 200 MHz with a 1 MHz resolution. Up to 16 channels may be simultaneously written and the system is DC write capable.

Controlling a bias current and/or voltage and write current may be done through software control of processor 120 and is well within the abilities of those of ordinary skill in the art.

In one embodiment, the stress bias (and write stress) may be selectable turned off to an MR element or group of MR elements, which is particularly advantageous if the MR element or group of MR elements is failing faster than other elements on the bar 103.

In operation, the bar 103 may be stressed for an extended period of time prior to testing. For example, the bar heater arm 102 may heat the bar 103 to, e.g., 100° C., while bias stress is applied to the MR elements, and if desired, a write stress is applied to some or all write elements. After a period of time, e.g., minutes to hours, the MR elements are then tested. The process of stressing and testing the bars may be repeated for any desired amount of time, e.g., days to weeks.

As illustrated in FIG. 1, a positioning system 110 is provided to move the bar heater arm 102 between the stress probe cards 104 and 106 to the test location. The positioning system 110 includes Y and Z actuators, indicated by arrows 111.

The test location includes at least one magnetic field generator, such as electromagnetic coils 132 and 134. Electromagnetic coils 132 and 134 may be, e.g., Helmholtz coils with windings, for producing an external magnetic field that is applied to the MR elements under test. A power supply (not shown), which is connected to and controlled by processor 120, is connected to the electromagnetic coils 132 and 134 and provides the excitation current to the electromagnetic coils.

Extending through the electromagnetic coils 132 and 134 are test probe cards 136 and 138. Each test probe card 136 and 138 includes four or eight probe pins, collectively 137 and 139, which are used to test one MR element per bar at a time. Test probe cards 136 and 138 may be similar to stress probe cards 104 and 106, but with fewer probe pins. Additionally, where 8 probe pins are used for Kelvinized measurement, i.e., 4 point probing, the tip diameter of the probe pins may be, e.g., 1 mil.

Test probe cards 136 and 138 are coupled to processor 120, which controls the test and stores the resulting data. The tests performed on the MR elements may be conventional write and MR resistance measurements well known in the art. Additional tests may also be used, such as those performed by the Blazer X5B manufactured by Integral Solutions, Int'l, located in San Jose, Calif. Additional tests that may be performed on the MR elements are described in more detail in U.S. patent application entitled "Magnetic Head Tester" having application Ser. No. 10/177,333, filed on Jun. 21, 2002, having the same assignee as the present disclosure and which is incorporated herein by reference.

The results of the testing may be displayed, e.g., on a monitor 116, shown in FIG. 1, that is coupled to the processor 120, shown in FIG. 2.

Figures 3A, 3B:
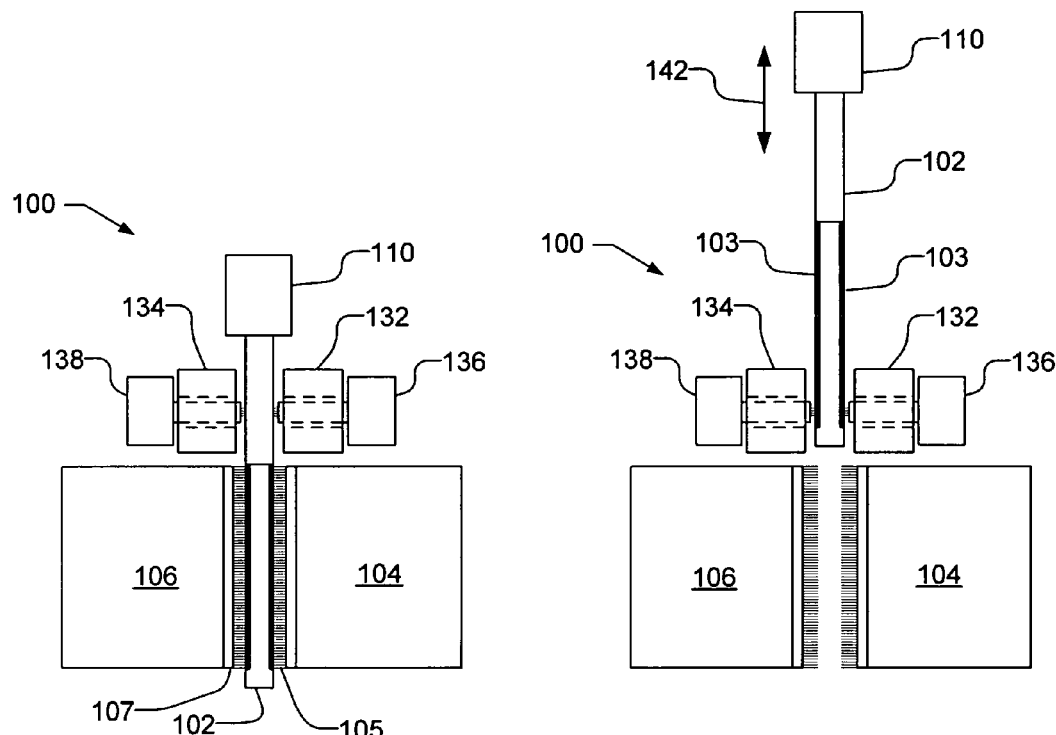
FIGS. 3A and 3B illustrate top views of the tester, with a bar held in the stress location and in the test location, respectively.

FIGS. 3A and 3B illustrate top views of tester 100, with the bar heater arm 102 holding the bars 103 in the stress location and in the test location, respectively. The positioning system 110 moves the bars 103 from the stress probe cards 104 and 106 to the test probe cards 136 and 138 by lowering the bars 103, along the Z axis (shown in FIG. 1), and moving the bars 103 in a direction parallel to the bar, i.e., along the Y axis, as indicated by arrow 142, then raising the bars 103 along the Z axis. Once the bar 103 is at the test location, the electromagnetic coils 132 and 134 generate the desired magnetic field and each MR element on each bar is individually tested, with positioning system 110 moving the bar 103 so that each MR element may be tested.

When two bars 103 are installed into arm 102 of tester 100, care must be taken to properly align the stress probe cards 104 and 106 so that all the probe pins 105 and 107 simultaneously contact the desired MR elements on the bars 103. By way of example, stress probe card 104 may be stationary, while stress probe card 106 is movable in the X, Y and Z directions as indicated by arrows 140 in FIG. 2 and arrows 111 in FIG. 1, using, e.g., positioning screws 141, 142, and 143 in FIG. 2. The test probe cards 136 and 138 are likewise adjusted with respect to each other. Moreover, the test probe cards 136 and 138 should be adjusted in the X direction with respect to the stress probe cards 104 and 106 so that tester 100 can move the bars 103 between the stress probe cards 104, 106 and the test probe cards 136, 138 without requiring movement in the X direction.

It should be understood that other mechanisms may be employed to transport the bar from the stress probe cards to the test probe cards. By way of example, it should be understood, that the present invention may use any relative motion between the bar and the probe cards. For example, if desired the bar may be held stationary and the stress probe cards and test probe cards and the magnetic field generator may be moved. Alternatively, both the bar and at least one of the stress probe cards and the test probe cards may be moved.

Figure 4:
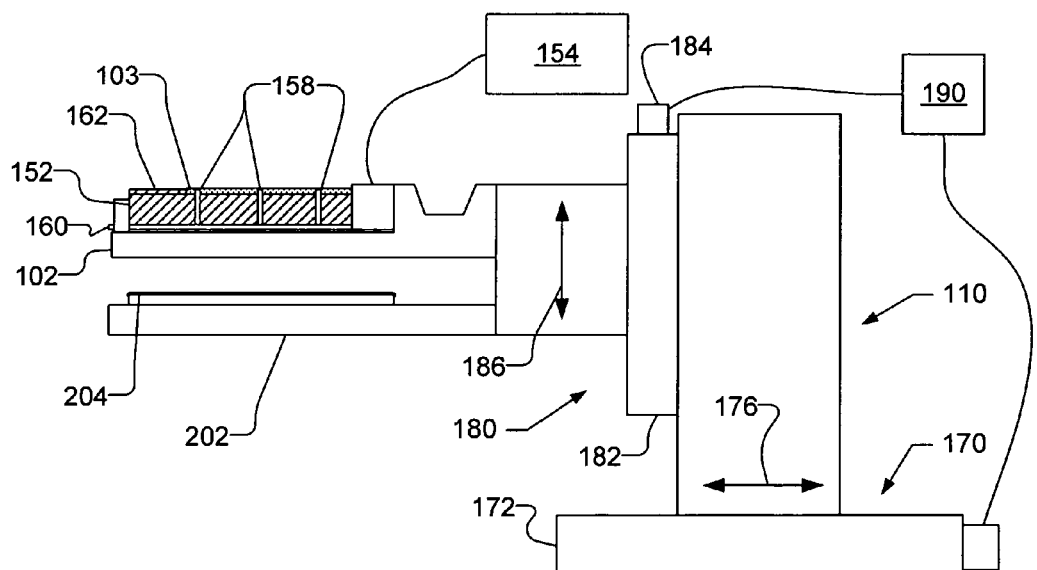
FIG. 4 illustrates a side view of the bar heater arm and the scrubbing arm and the positioning system.

FIG. 4 illustrates a side view of the bar heater arm 102 with a bar 103 mounted thereon and the positioning system 110. Bar heater arm 102 includes a heater block 152, which is, e.g., a copper or copper alloy block with a layer of vitreous carbon applied by chemical vapor deposition (CVD). The bar 103 is mounted with air bearing surface (ABS) and MR elements toward and pressed into contact with the heater element. Thus, a thermally conductive but electrically insulating material, such as vitreous carbon, is useful conducting heat to the MR elements without shorting the MR elements.

Embedded in the heater block 152 is a heater and sensor, which are coupled to a temperature controller, shown schematically as block 154. A closed loop temperature control is used. By way of example, the heater and sensor may be purchased from Lake Shore Cryotronics, Inc. of Westerville Ohio as the 50 Watt Cartridge Heater HTR-50 and the Platinum Resistance Sensor PT-103, respectively. The temperature controller may likewise be purchased from Lake Shore Cryotronics, Inc. as the LS-331 Temperature Controller.

In another embodiment, the bar arm 102 includes a cooling element 152 which may be used to cool the MR elements. By way of example, a Peltier cooler may be used. Thus, the bar arm 102 may include a temperature control element that controls the temperature of the MR elements, by heating or cooling the MR elements. If desired, both a cooling element and a heating element may be used in order to provide a temperature control of the MR elements. The temperature control element may heat or cool the MR elements sufficiently to apply a thermal stress to the MR elements if desired.

The temperature control element may be used to subject the MR elements to temperatures that are above or below the normal operating temperatures of the MR elements or, if desired, to subject the MR elements to temperatures that replicate normal operating temperatures, e.g., between approximately 15° C. and 50° C. The thermal control of the MR elements either within the normal operating temperature range or outside the normal operating temperature range is generally referred to herein as the application of thermal stress to the MR elements.

The heater block 152 is mounted on arm 102 with insulating ceramic washers disposed between the heater block 152 and the arm 102. A plurality of clamps 158 press the bar 103 against the heater block 152. Clamps 158 are opened and closed, e.g., via a screw mechanism 160. The clamps 158 hold bars 103 against the heater block 152, but allow for lateral expansion of the bars 103 due to heating. Heater block 152 includes an indentation 162 along each side at the upper surface to accommodate the bars 103. The indentation 162 includes a hardstop and has sufficient length to accommodate different length bars, e.g., 30 to 100 mm length bars, plus any heating expansion of the bars. The hardstop in the indentation 162 allows the bars 103 to be loaded in a known position.

The arm 102 is coupled to the positioning system 110, which includes a Y actuator 170 and a Z actuator 180. The Y actuator 170 includes a precision stage 172 and a linear motor 174 that moves the arm 102 along the Y direction, as indicated by arrow 176. By way of example, the Y stage 172 may be manufactured by IKO International, Inc. as part number TU 50S 36/1X SG5E149, which has a linear accuracy of 0.008 mm, a positioning accuracy of 0.020 mm, and a repeatability of +/−0.002 mm. Because only a portion of the full stroke is required while probing the bar 103 during testing, the absolute positioning accuracy for probing the bar is 0.005 mm or better. The Y motor 174 may be a Pacific Scientific stepper motor with 800 count encoder, part number M22NR-XBJDN-HHOO.

The Z actuator 180 similarly includes a precision stage 182 and a linear motor 184, which move the arm 102 in the Z direction, as indicated by arrow 186. By way of example, the Z stage 182 may be manufactured by THK as part number KR2001A-100LP0-1700, which has a linear accuracy of 0.010 mm, positioning accuracy of 0.020 mm, and a repeatability of +/−0.003 mm. The Z motor 184 may be, e.g., an Applied Motion Products motor, part number HT17-075-D with US Digital Encoder (800 count), part number E5S-200-197-ITH.

The motors in the positioning system 110 are controlled by a motor driver 190, which may also be coupled to the processor 120 shown in FIG. 1. By way of example, the motor driver may be manufactured by API Controls, located in Rockford, Ill., as the P325 Series Low EMI Microstep Drive model.

As discussed above, the bar 103 is stressed with bias stress (and write stress) as well as with elevated temperature via the heater block 152. The inventors discovered that due to the elevated temperature of the bar 103 and the amount of time that the probe pins 105 and 107 are in contact with the heated bar 103, the probe pins 105 and 107 will become oxidized. Oxidation creates increased contact resistance, which interferes with the application of the desired bias and write stresses. The oxidation occurs quickly relative to the length of a typical lifecycle test, which may last a month. For example, a significant amount of oxidation may occur after a few days of stressing the bar 103.

Thus, in accordance with another embodiment of the present invention, tester 100 includes an abrasive element, such as abrasive pad 204, that is used to abrasively clean the probe pins, in situ, of oxide or any other particles. By removing oxide, the probe pins are able to make better contact with the MR elements (and write elements). The abrasive pad 204 may be used to clean both the probe pins 105 and 107 of the stress probe cards 104 and 106 as well as the probe pins 137 and 139 of the testing probe cards 136 and 138, but test probe pins generally need to be cleaned less frequently the stress probe pins.

Abrasive pad 204 may be bonded to the top of a scrubbing arm 202, which is coupled to heater arm 102 and, thus, is advantageously controlled by positioning system 110. Abrasive pad 204 may be, e.g., an aluminum oxide or diamond lapping plate. By way of example, the abrasive pad 204 may be a lapping film manufactured by 3M as 266X Imperial™ or diamond lapping plate 6MB1.

During cleaning the abrasive pad 204 is pressed against the probe pins 105 and 107, via the Z actuator 180, and the scrubbing arm 204 is moved back and forth in the Y direction, approximately 8 mil, via the Y actuator 170, for, e.g., 5 cycles.

It should be understood that other mechanisms may be employed to abrade the probe pins 105, 107. For example, it not necessary that the abrasive pad 204 is coupled to or controlled by the same positioning system as arm 102. Thus, if desired additional actuators may be employed to abrade the probe pins with the abrasive pad 204. Further, it should be understood that the present invention may use any relative motion between the abrasive pad 204 and the probe cards. For example, if desired the abrasive pad may be held stationary and the stress probe cards may be moved. Alternatively, both the abrasive pad 204 and the probe cards may be moved. Further, it should be understood that the abrading pad may contact less than all the probe pins at a time. For example, the abrading pin may contact a single probe pin at a time. Accordingly, all probe pins or a subset of all the probe pins may be abraded at any one time.

Figure 5A:
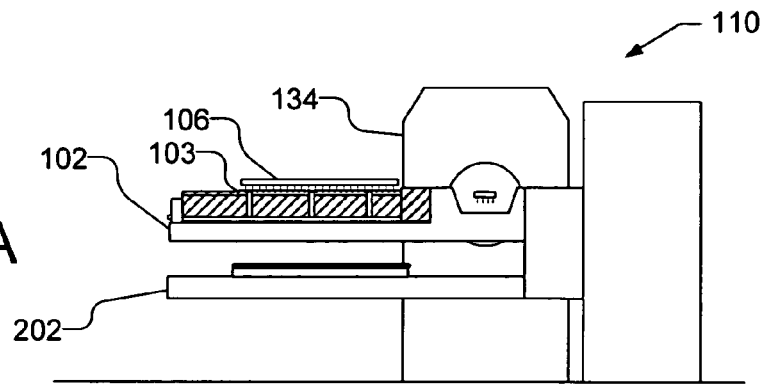
FIGS. 5A, 5B, 5C, and 5D illustrate side views of a portion of tester with the arm holding a bar in various positions.
Figure 5B:
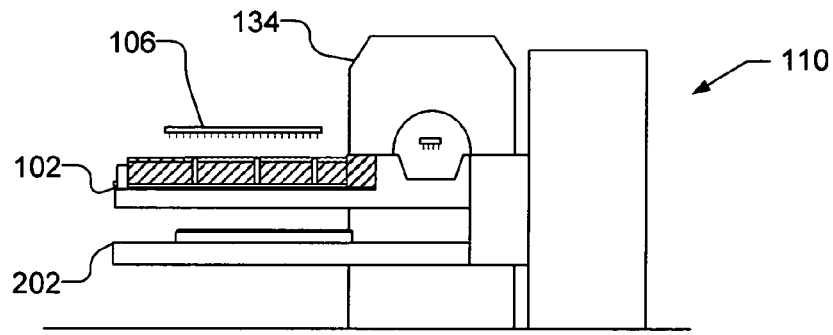

FIGS. 5A, 5B, 5C, and 5D illustrate side views of a portion of tester 100 with the arms 102 and 202 in various positions. It should be understood that stress probe card 104, test probe card 136 and electromagnetic coil 132, are not shown in FIGS. 5A–5D for the sake of clarity. Moreover, the individual Y and Z actuators are not shown in FIGS. 5A–5D for the sake of simplicity. FIG. 5A illustrates a side view of arm 102 positioned to place bar 103 in contact with the stress probe card 106. As illustrated in FIG. 5B, the positioning system 110 moves arm 102 downward to disengage the bar 103 from the stress probe card 106.

Figure 5C:
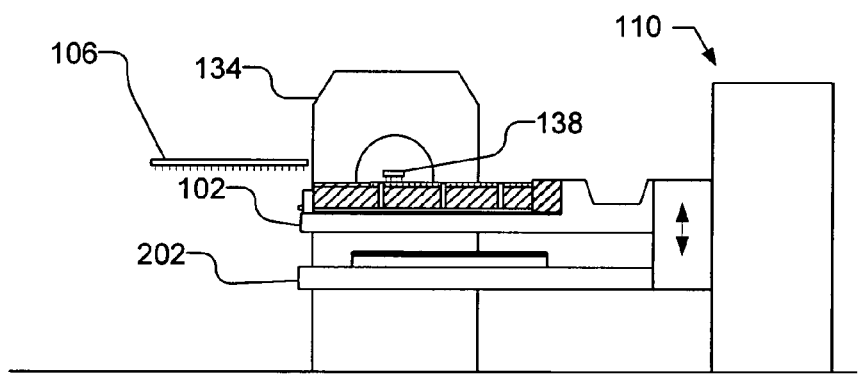

FIG. 5C illustrates the arm 102 positioned to place bar 103 in contact with the test probe card 138 which extends through the center of the electromagnetic coil 134. To test an MR element on the bar 103, the arm 102 moves the bar 103 under and then upwards to engage the MR element with the test probe card 138. To disengage, the arm 102 moves downward and then laterally to position the next MR element under the test probe card 138. Thus, a subset, e.g., 1, of all the MR elements is tested incrementally. When the testing of the MR elements is complete, the arm 102 may move back to engage the bar 103 with the stress probe card 106. As can be seen in FIG. 5C, the test probe card 138 is at a different height than the stress probe card 106 so that the entire length of the bar 103 may be tested by test probe card 138 without interference from the stress probe card 106.

In one embodiment, the tester 110 uses the measured resistance values from the stress probe cards 104, 106, and the test probe cards 136, 138, to determine when there is contact between the probe pins and the bar 103. Thus, for example, when placing a bar 103 in contact with the probe pins on the stress probe card, the Z actuator 180 raises the arm 102 until the stress probe card measures a decreased resistance, indicating that the probe pins are in contact with the bar 103. The Z actuator 180 may continue to raise the arm 102 by a predetermined amount, e.g., 3 mil, to apply the desired contact force between the probe pins and the MR elements. The vertical position of the bar 103 with respect to the test probe cards may likewise be determined based on measured resistance.

It should be understood that because MR elements are sensitive to electrostatic discharge, prior to engaging or disengaging contact between the bar 103 and either the stress probe cards or the test probe cards, the probe pins are grounded.

Figure 5D:
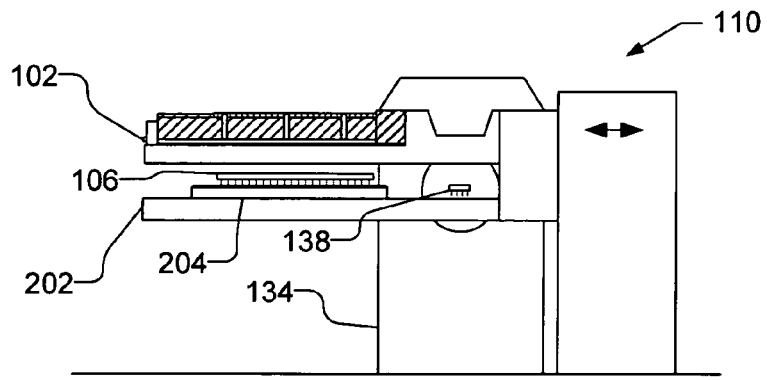

FIG. 5D illustrates the abrasive pad 204 positioned in contact with the probe pins 107 of the stress probe card 106. Once the desired contact is made between the abrasive pad 204 and the probe pins, the positioning system 110 moves arm 102 back and forth in the Y direction by, e.g., 8 mil, for the desired scrubbing cycles. To engage the abrasive pad 204 with the probe pins, the positioning system moves in the Y direction until the end of arm 102 and scrubbing arm 202 are beyond the test probe cards. The positioning system 110 then moves the arm 102 vertically and then laterally to place the stress probe cards between the arm 102 and scrubbing arm 202. The positioning system 110 then raises the arm 102 until the abrasive pad 204 makes the desired contact with the pins of the stress probe card 106. The pins of the test probe card 138 can be similarly cleaned.

In one embodiment, contact between the scrubbing arm and the probe pins can be determined by the resistance measurement from the probe pins, particularly where the abrasive pad 204 uses an electrically conductive material (such as a diamond lapping plate). Alternatively, the height of the probe pins may be predetermined and the abrasive pad 204 is then moved to that predetermined height.

In one embodiment, the tester may be used to stress and test individual MR elements, i.e., after the MR elements are sliced from the bar form. For example, the MR elements may be in slider form. If desired, the MR elements may be tested after being mounted, e.g., in a head gimbal assembly (HGA) or head stack assembly (HSA). This is advantageous compared to conventional systems, which is limited to the number of heads due to constraints of the magnetic field and the types of tests due to the use of long cable connects. Moreover, testing the MR elements at a stage further along in the production process, e.g., in slider, HGA or HSA form instead of in bar form, is advantageous as the test data is more representative of the final product.

FIG. 6A, by way of example, illustrates a top view of an arm 200 that holds a plurality of individual MR elements in the form of sliders 206. The arm 200 may be used in the tester 100 shown in FIG. 1 in place of the bar heater arm 102. The arm 200 may include a heating or cooling element as described above. In one embodiment, the sliders 206 are held on the arm 200 by way of vacuum pressure. For example, the arm 200 may include a number of recessed pockets 202, each of which includes apertures 204 through which vacuum pressure from vacuum pump 208 is applied. By way of example, two sliders 206 may be held in each of the pockets 202 by way of the vacuum pressure from apertures 204. It should be understood that vacuum pressure should remain on while the arm 200 moves the sliders 206 from the stress location to the test location in the tester 100 and during the stressing and testing. During placement of the sliders 206 into the pockets 202, the sliders 206 are lightly pressed against the back wall and side wall of the pocket 202 in order to accurately position the slider 206 within the pocket. Accurately positioning the slider 206 within the pocket 202 is useful in aiding the alignment between the pins of the stress probe element and the test probes element with the contacts on the back of the slider 206 (not shown). If desired, the arm 200 may include two rows of pockets.

Alternatively, a mechanical clamp 203 may be used, as illustrated in FIG. 6B. As illustrated in FIG. 6B, the sliders 206 may be pressed against each other and pressed against the back and at least one side of a large pocket 202 of the arm 200. Of course, other clamping mechanisms may be used if desired.

FIG. 7 illustrates a top view of another embodiment of an arm 250 that holds a plurality of individual MR elements 252 in the form of head gimbal assemblies (HGAs) 254. The MR elements 252 are shown in FIG. 7 for clarity, but it should be understood that the MR elements 252 are typically held on the bottom surface of the HGA 254. The arm 250 may be used in the tester 100 shown in FIG. 1 in place of the bar heater arm 102. The HGAs 254 can be mounted on the arm 250 using conventional mounting techniques for the HGA, e.g., apertures in the HGA are pressed onto posts on the arm 250. The MR elements 252 are in thermal contact with a temperature control element 256, which may be separate to or integral to the arm 250. If the temperature control element 256 is separate from the arm 250, in one embodiment, the temperature control element 256 moves with the arm 250 between the stressing and testing locations. The temperature control element 256 may include a heating element, a cooling element or both, as described above. The MR elements 252 in a HGA 254 are electrically connected to pads 260 on a flexure 258. Thus, the probe pins on the stress probe element and the test probe element can make electrical contact with the MR elements 252 by way of the pads 260 on the flexure 258. Due to the relatively large size of the pads 260 on the flexure 258, compared to the contacts on the MR elements 252, the probe pins on the stress probe element and the test probe element may be pogo pins in one embodiment, which will reduce the need to periodically abrade the probe pins to make good contact with the MR elements 252. Nevertheless, it may be desirable to periodically abrade the probe pins in the present embodiment, which may be performed, e.g., as described above.

It should be understood that probe pins include any connector that makes electrical contact with the magnetoresistive element. Thus, probe pins include pogo pins, semiconductor probe pins, leaf springs, and conductive contact pads or any other connector. For example, the probe pins may be considered the mating connector used in the actual drive for a Head Stack Assembly, which is discussed below.

Figure 8:
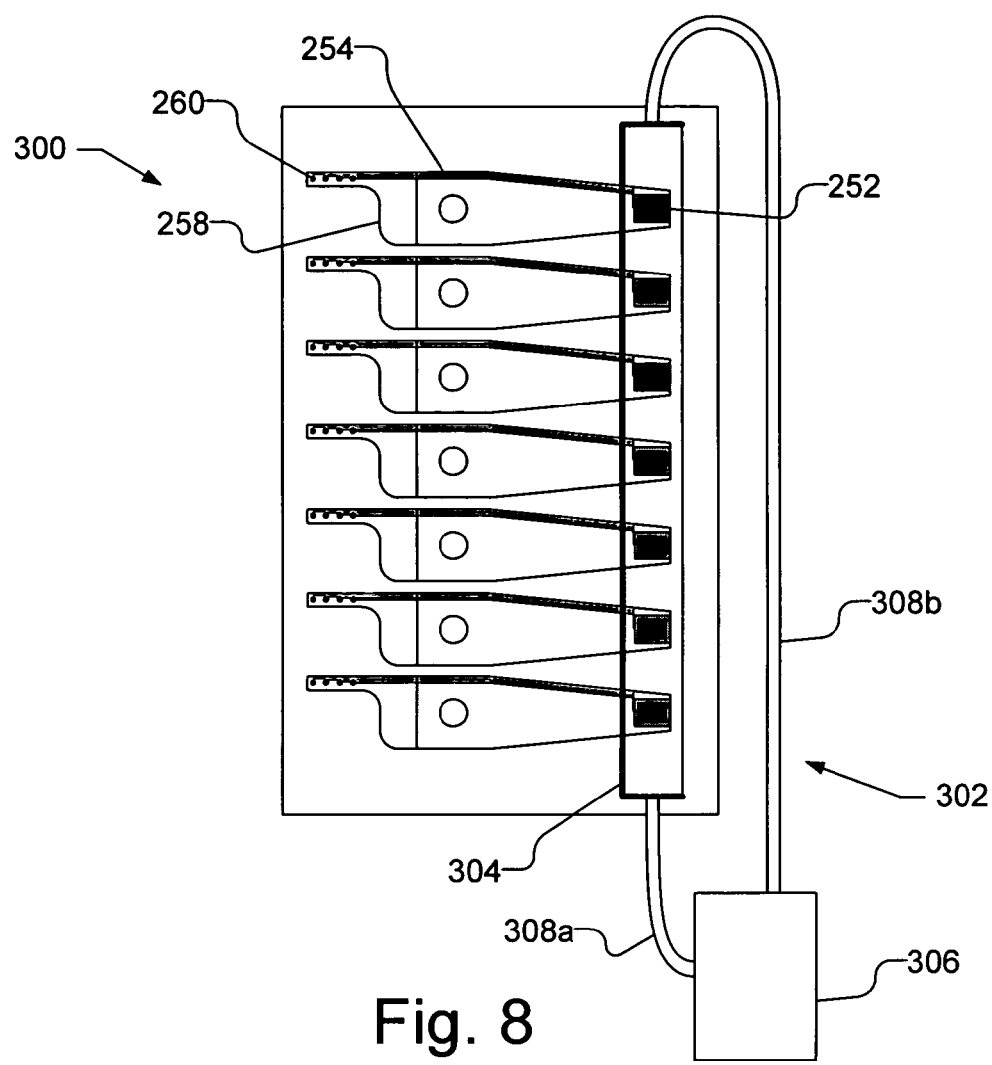
FIG. 8 illustrates a top view of another embodiment of an arm that holds a plurality of individual MR elements in a chamber that controls the localized ambient temperature surrounding the MR elements.
Figures 9A, 9B:
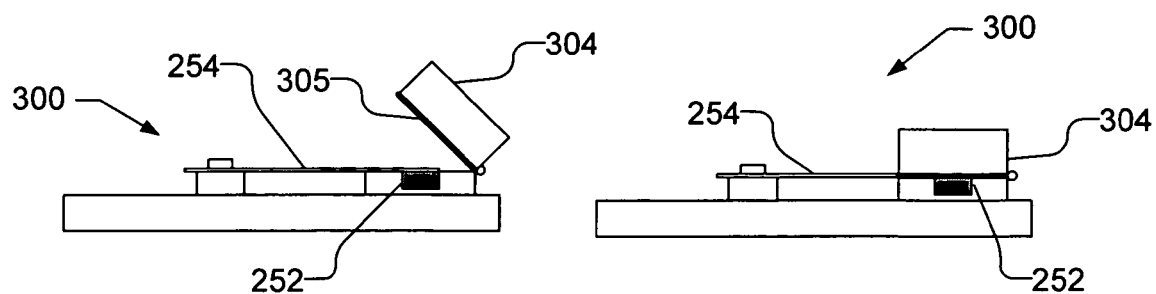
FIGS. 9A and 9B illustrate a side view of the arm from FIG. 8 with a MR element with the chamber open and closed, respectively.

FIG. 8 illustrates a top view of another embodiment of an arm 300 that holds a plurality of individual MR elements 252 in the form of head gimbal assemblies (HGAs) 254. Arm 300 is similar to the arm 250 described in FIG. 7, like designated reference being the same. Arm 300, however, includes a temperature control element 302 that heats and/or cools the MR elements 252 by altering the localized ambient temperature surrounding the MR elements 252 within a chamber 304. FIGS. 9A and 9B illustrate a side view of the arm 300 with a MR element 252 with the chamber 304 open and closed, respectively. As can be seen in FIGS. 9A and 9B, the chamber may open to accept the MR elements 252 and includes a gasket 305 to provide a sealed environment around the MR elements 252. As can be seen in FIGS. 8, 9A and 9B, the MR elements 252 fit within the chamber 304, but the remainder of the HGA 254 is external to the chamber 304. Thus, the electrical contacts can be made external to the chamber 304. Moreover, the remainder of the tester 100 (shown in FIG. 1) is external to the chamber 304 and is therefore unaffected by the changes in the temperature.

As can be seen in FIG. 8, a temperature pump 306, which is sometimes referred to as a heat pump, is coupled to the chamber 304, e.g., by way of a primary conduit 308a and return conduit 308b. The MR elements 252 are held in the chamber 304 during stressing and testing, so it should be understood that the conduits 308a and 308b should be of sufficient length to permit the necessary degree of movement. The temperature pump 306 include a heater or cooler and a fan to provide hot and/or cool gas to the sealed chamber 304 in order to alter the localized ambient temperature around the MR elements 252. The hot or cool gas used may include air or gas such as nitrogen or argon. The temperature pump 306 may also include a dehumidifier that can be used to control the localized humidity around the MR elements 252, e.g., in order to reduce or eliminate condensation during cooling of the MR elements 252. Because the chamber 304 is sized to accept only the MR elements 252 and a small portion of the remainder of the HGA 254, the heating and/or cooling of the environment in the chamber 304 is relatively efficient.

It should be understood that the use of the temperature control element 302 is not limited to HGAs, but may be used with, e.g., a head stack assembly, or individual sliders or bars. With the use of sliders or bars, contact is made with the MR elements within the chamber and contact leads extend out of chamber 304. The probe pins of the stress probe element and test probe element make electrical contact with the contact leads that extend out of the chamber.

Figure 10:
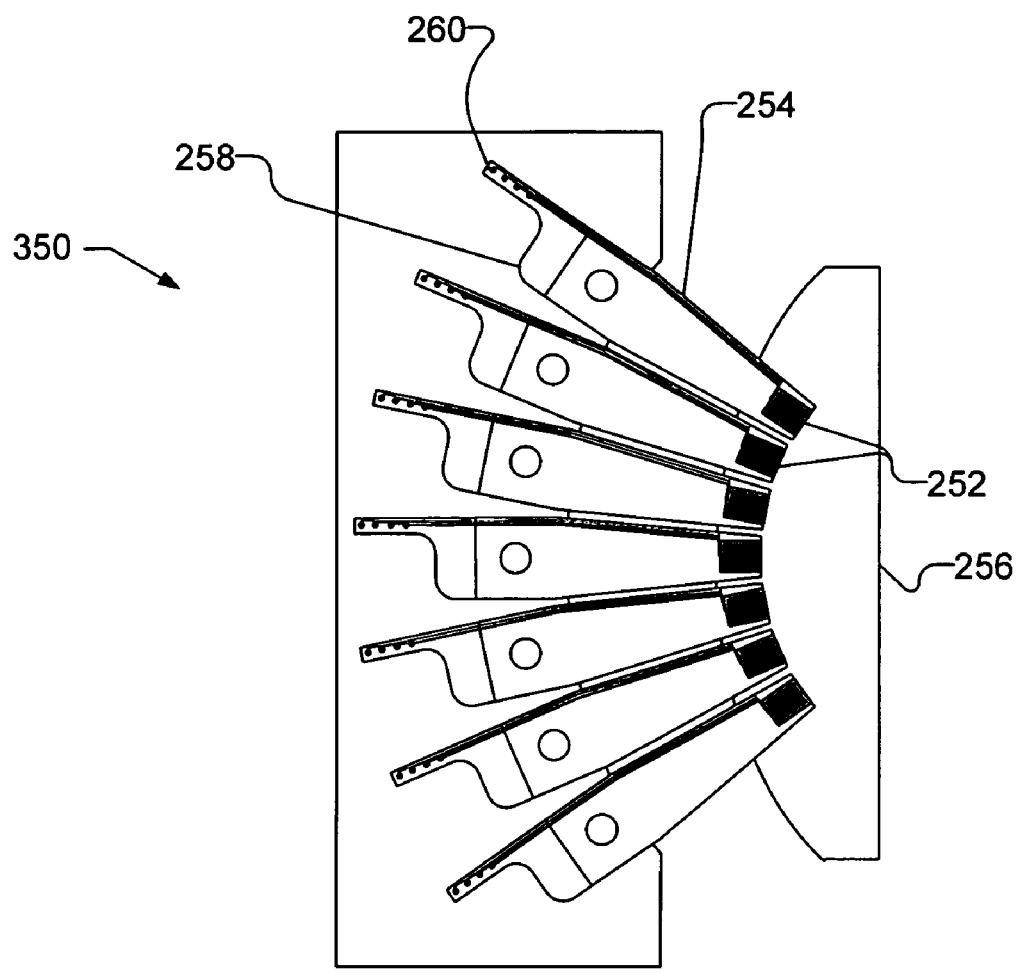
FIG. 10 illustrates a top view of another embodiment of an arm that holds a plurality of individual MR elements in the form of head gimbal assemblies (HGAs) in a non-linear fashion.

FIG. 10 illustrates a top view of another embodiment of an arm 350 that holds a plurality of individual MR elements 252 in the form of head gimbal assemblies (HGAs) 254. Arm 350 is similar to the arm 250 described in FIG. 7, like designated reference being the same. As illustrated in FIG. 10, however, the HGAs 254 may be held on arm 350 in a manner that minimizes the space between the MR elements 252. With the MR elements 252 positioned in the manner shown in FIG. 10, the positioning system 110 of tester 100 (FIG. 1) may sequence the MR elements 252 through the magnetic field in a non-linear fashion, e.g., provide rotational movement to the arm 350 and HGAs 254, so that each MR element 252 will have the same orientation within the magnetic field.

Figure 11:
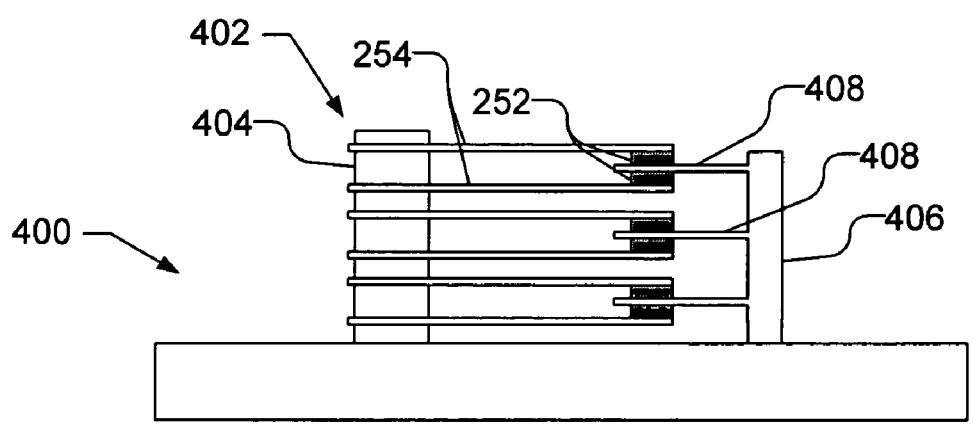
FIG. 11 illustrates a side view of an arm that holds individual MR elements in a head stack assembly.

FIG. 11 illustrates a side view of an arm 400 that holds individual MR elements 252 in a head stack assembly 402. As is known in the art, a head stack assembly (HSA) 402 is a stack of HGA 254, each of which includes a slider with an MR element 252. In some embodiments, an HSA 402 may include only a single MR element 252 or a pair of opposing MR elements 252. The HGAs 254 are held in a stacked arrangement on an E-block actuator 404 and all the leads from the HGAs are connected to a pre-amp chip (not shown). The E-block actuator 404 may be removably mounted on the arm 400. As shown in FIG. 11, a temperature control element 406 is placed in thermal contact with the MR elements 252. By way of example, the temperature control element 406 may include a plurality of arms, each of which extends between and is in contact with each pair of up and down facing MR elements 252. Where the HSA 402 includes only a single MR element or a pair of MR elements, a single arm may be used in the temperature control element.

If desired, the mating connector used in the actual drive for the HSA may be used as the probe pins.

Although the invention has been described with reference to particular embodiments, the description is only an example of the invention's application and should not be taken as a limitation. For example, the MR elements may be at any level including wafer, bar, slider, HGA, HSA, or any other desired level. Various other adaptations and combinations of features of the embodiments disclosed are within the scope of the invention as defined by the following claims.

What is claimed is:

1. An apparatus for stressing and testing a plurality of magnetoresistive elements, the apparatus comprising:
   at least one stress probe element having a plurality of probe pins;
   a temperature control element for controlling the temperature of a plurality of magnetoresistive elements;
   at least one magnetic field generator;
   at least one test probe element having a plurality of probe pins, the probe pins of the test probe element being positioned to electrically connect with at least one magnetoresistive element when the at least one magnetoresistive element is within the magnetic field produced by the magnetic field generator; and
   a positioning system for placing the magnetoresistive elements and the probe pins of the stress probe element in electrical contact and placing at least one magnetoresistive element and the probe pins of the test probe element in electrical contact when the at least one magnetoresistive element is within the magnetic field.

2. The apparatus of claim 1, wherein the plurality of magnetoresistive elements are in a form selected from the group comprising at least one bar, sliders, head gimbal assemblies, and head stack assembly.

3. The apparatus of claim 1, the apparatus further comprising:
   an arm coupled to the temperature control element; and
   a means for removably holding the magnetoresistive elements on the arm.

4. The apparatus of claim 1, the apparatus further comprising an arm coupled to the temperature control element, wherein the magnetoresistive elements are removably held on the arm and are in thermal contact with the temperature control element, wherein the arm is coupled to the positioning system, the positioning system moving the magnetoresistive elements between the stress probe element and the test probe element.

5. The apparatus of claim 1, wherein the positioning system comprises:
   a first actuator that moves the magnetoresistive elements along a horizontal axis to move the magnetoresistive elements from the at least one stress probe element and the at least one test probe element; and
   a second actuator that moves the magnetoresistive elements vertically to make electrical contact with the probe pins of the stess probe element when the magnetoresistive elements are positioned at the at least one stress probe element and to make electrical contact with the probe pins of the test probe element when the magnetoresistive elements are positioned at the at least one test probe element.

6. The apparatus of claim 1, wherein the plurality of probe pins in the at least one stress probe element and the plurality of probe pins in the test probe element are at least one of pogo pins, semiconductor probe pins, leaf springs, and conductive contact pads.

7. The apparatus of claim 1, wherein the plurality of magnetoresistive elements is at least one head stack assembly and wherein the temperature control element comprises at least one arm that contacts a slider on the head stack assembly.

8. The apparatus of claim 1, wherein the temperature control element comprises a heating element and a cooling element.

9. The apparatus of claim 1, wherein the temperature control element comprises:
   a chamber in which the plurality of magnetoresistive elements are held while the probe pins of the at least one stress probe element, the probe pins of the at least one test probe, the at least one magnetic field generator and the positioning system are outside the chamber;
   a temperature pump coupled to the chamber to provide at least one of hot and cool gas to the inside of the chamber.

10. The apparatus of claim 9, wherein the temperature pump includes a dehumidifier to dehumidify the gas in the chamber.

11. The apparatus of claim 1, further comprising an abrasive element and a means for placing the abrasive element and at least one of the probe pins of the stress probe element in contact.

12. The apparatus of claim 1, further comprising an abrasive element and a means for placing the abrasive element and at least one of the probe pins of the test probe element in contact.

13. The apparatus of claim 1, wherein the at least one probe pin of the stress probe element is placed in electrical contact with a write element on the magnetoresitive element through which the stress probe element applies a write current to the magnetoresitive element.

14. The apparatus of claim 1, wherein the positioning system comprises at least one actuator that sequences the magnetoresitive element through the magnetic field in a non-linear fashion.

15. The apparatus of claim 1, wherein the positioning system positions the magnetoresistive elements within the magnetic field.

16. A method of stressing and testing a plurality of magnetoresistive elements, the method comprising:
   controlling the temperature of the magnetoresistive elements and providing a bias stress to the magnetoresistive elements;
   moving at least one of the magnetoresistive elements and a magnetic field generator; and
   testing the magnetoresistive elements when positioned within a magnetic field generated by the magnetic field generator.

17. The method of claim 16, wherein providing a bias stress to the magnetoresistive elements comprises:
   placing a plurality of probe pins in electrical contact with the magnetoresistive elements; and
   applying one of a bias current and a bias voltage to the magnetoresistive elements.

18. The method of claim 17, further comprising abrading at least one of the plurality of probe pins.

19. The method of claim 17, wherein moving at least one of the magnetoresistive elements and a magnetic field generator comprises:
   disengaging the plurality of probe pins from the magnetoresistive elements; and
   moving the magnetoresistive elements to the magnetic field generator.

20. The method of claim 16, wherein testing the magnetoresistive elements when positioned within a magnetic field generated by the magnetic field generator comprises:
placing a plurality of probe pins in electrical contact with at least one magnetoresistive element;
generating the magnetic field around the at least one magnetoresistive element; and
measuring at least one parameter from the at least one magnetoresistive element while in the magnetic field.

21. The method of claim 20, further comprising abrading at least one of the plurality of probe pins.

22. The method of claim 16, further comprising stressing the magnetoresistive elements by providing a write current to a write element.

23. The method of claim 16, further comprising controlling the temperature of the magnetoresistive elements while testing the magnetoresistive elements.

24. The method of claim 16, wherein controlling the temperature of the magnetoresistive elements comprises heating the magnetoresistive elements.

25. The method of claim 16, wherein controlling the temperature of the magnetoresistive elements comprises cooling the magnetoresistive elements.

26. The method of claim 16, wherein the plurality of magnetoresistive elements are selected from the group comprising at least one bar, sliders, head gimbal assemblies and at least one head stack assembly.

27. The method of claim 16, wherein controlling the temperature of the magnetoresistive elements comprises providing at least one of a heated and cooled ambient environment around the magnetoresistive elements, wherein the at least one of a heated and cooled ambient environment is localized to the magnetoresistive elements.

28. The method of claim 27, the method further comprising dehumidifying the ambient environment around the magnetoresistive elements.

29. A method of stressing and testing a plurality of magnetoresistive elements, the method comprising:
controlling the temperature of the magnetoresistive elements;
placing a first plurality of probe pins in electrical contact with the magnetoresistive elements;
applying one of a bias current and a bias voltage to the magnetoresistive elements through the first plurality of probe pins;
disengaging the first plurality of probe pins from the magnetoresistive elements;
placing a second plurality of probe pins in electrical contact with at least one magnetoresistive element;
generating a magnetic field around the at least one magnetoresistive element; and
measuring at least one parameter from the at least one magnetoresistive element through the second plurality of probe pins while the at least one magnetoresistive element is in the magnetic field.

30. The method of claim 29, further comprising moving at least one of a magnetic field generator and the magnetoresistive elements after disengaging the first plurality of probe pins from the magnetoresistive elements.

31. The method of claim 29, further comprising abrading at least one of the first plurality of probe pins.

32. The method of claim 29, further comprising abrading at least one of the second plurality of probe pins.

33. The method of claim 29, further comprising controlling the temperature of the magnetoresistive elements while measuring at least one parameter from the at least one magnetoresistive element.

34. The method of claim 29, wherein controlling the temperature of the magnetoresistive elements comprises providing at least one of a heated and cooled ambient environment around the magnetoresistive elements, wherein the at least one of a heated and cooled ambient environment is localized to the magnetoresistive elements.

35. The method of claim 34, the method further comprising dehumidifying the ambient environment around the magnetoresistive elements.

36. The method of claim 29, wherein the plurality of magnetoresistive elements are selected from the group comprising at least one bar, sliders, head gimbal assemblies and at least one head stack assembly.

37. The method of claim 29, wherein placing a first plurality of probe pins in electrical contact with the magnetoresistive elements comprises at least one of moving the first plurality of probe pins relative to the magnetoresistive elements and moving the magnetoresistive elements relative to the first plurality of probe pins.

38. The method of claim 29, wherein placing a second plurality of probe pins in electrical contact with at least one magnetoresistive element comprises at least one of moving the second plurality of probe pins relative to the at least one magnetoresistive element and moving the at least one magnetoresistive element relative to the second plurality of probe pins.

* * * * *